United States Patent [19]

Böhmer et al.

[11] Patent Number: 5,452,905
[45] Date of Patent: Sep. 26, 1995

[54] SPINNING PLATE FOR SUBSTRATES

[75] Inventors: Gudrun Böhmer, Stuttgart; Josef Gentischer, Remshalden; Rolf Lehner, Esslingen; Dieter Modjesch, Nufringen; Wolfgang Schmutz, Zimmern, all of Germany

[73] Assignee: International Business Machines Corporation, Armonk, N.Y.

[21] Appl. No.: 975,536

[22] PCT Filed: Jul. 26, 1991

[86] PCT No.: PCT/EP91/01405

§ 371 Date: Feb. 7, 1994

§ 102(e) Date: Feb. 7, 1994

[87] PCT Pub. No.: WO92/02949

PCT Pub. Date: Feb. 20, 1992

[30] Foreign Application Priority Data

Aug. 3, 1990 [DE] Germany ............... 40 24 642.6

[51] Int. Cl.⁶ .................. B23Q 3/08; B25B 11/00
[52] U.S. Cl. ................ 279/3; 269/21; 451/289; 451/388
[58] Field of Search ................ 279/3, 133, 156; 269/21; 51/235; 451/289, 388

[56] References Cited

U.S. PATENT DOCUMENTS

| | | | |
|---|---|---|---|
| 1,130,679 | 3/1915 | Staunton | 279/3 |
| 1,457,247 | 5/1923 | Hreschede et al. | 279/3 |
| 3,389,682 | 6/1968 | Gardner | 279/3 |
| 4,659,094 | 4/1987 | Leonov | 279/3 |
| 4,784,377 | 11/1988 | Woodward | 269/21 |
| 5,171,031 | 12/1992 | Nishiyama | 279/133 |

FOREIGN PATENT DOCUMENTS

| | | | |
|---|---|---|---|
| 51-121227 | 7/1982 | Japan . | |
| 0124537 | 7/1984 | Japan | 279/3 |
| 63-258667 | 10/1988 | Japan . | |
| 405082565 | 4/1993 | Japan | 279/3 |

OTHER PUBLICATIONS

"Centering Chuck System", by H. A. Appenzeller et al., in IBM Technical Disclosure Bulletin, vol. 21, No. 7 (Dec. 1978), pp. 2770–2771.

Primary Examiner—Steven C. Bishop
Attorney, Agent, or Firm—William D. Sabo

[57] ABSTRACT

A spinning plate for substrates has on the surface of its spinning disk a continuous seal that is pressed from below against the edge of the substrate. The substrate can thus be retained by suction on the spinning disk. In order to center the substrate, a pressing element is moved under suction against the edge of the substrate and presses the same against centering stops of supporting blocks.

8 Claims, 2 Drawing Sheets

SPINNING PLATE FOR SUBSTRATES

The invention concerns a spinning plate for substrates.

Substrates have one or two facing active surfaces which frequently must not be touched and contaminated. The substrates are handled by their surrounding edges projecting from the active surfaces. For treating the active surfaces with flowable substances, such as resists, cleaning agents, or the like, the substrates are placed on spinning plates rotating at high speed so that the flowable substance is uniformly distributed on the active surface and excess substance is spun off.

There are essentially three types of substrate spinning devices. In the first type of device, the substrate is arranged on a turnstile with eight receiving pins at its ends. The second type of device comprises a spinning plate with a circular plate (disk) on the surface of which support blocks are positioned. The support blocks have a horizontal bearing surface, supporting the edge of the substrate, and a vertical support face which radially secures the substrate against the centrifugal forces occurring. Such a device is described, for example, in the Patent Abstracts of Japan, JP-A-57 121 227. The third type of device comprises a spinning plate with a disk having a milled recess for accommodating the substrate. The substrate is lowered into and lifted from this milled recess by means of pins.

With all of these known spinning plates, the substrate is loosely arranged thereon. On the spinning plate, the substrate is merely retained by gravity and radially secured against centrifugal forces. Therefore, it may happen during the spinning process that the substrate becomes detached from the spinning plate and is spun off by the high centrifugal forces. This leads to destruction of the substrate, which may be very expensive, for example, with ceramic substrates, and to damage of the equipment.

A special device for fixing the substrate on a spinning plate is known from the Patent Abstracts of Japan JP-A 63 258 667. With this device, the substrate is pressed against the spinning plate at reduced pressure and retained there during spinning.

It is the object of the invention to provide a spinning plate for substrates on which the substrates are automatically centered and reliably retained during spinning.

For a spinning plate of the previously described kind, this object is accomplished according to the invention by the features of the characterizing part of claim 1.

With the known spinning plates, the substrate is accommodated with a radial play necessary for its insertion and removal, without being accurately centered. According to the invention however the substrate is accurately centered by being forced against defined centering stops by means of a pressure element. As square, rectangular or multi-edge substrates and circular substrates are accurately aligned relative to the centering stops and thus to the rotational axis of the spinning plate by means of defined reference edges and defined reference points, respectively, they may be photo-optically scanned and tested or otherwise treated on the spinning plate.

The substrate is preferably centered by the pressure element with the aid of the vacuum applied through the drive shaft, so that for actuating and controlling the pressure element no high mechanical forces have to be applied to the rotating plate. The pressure element is preferably actuated by a membrane to which a vacuum is applied and by an actuating means. A throttle means ensures that the vacuum applied through the vacuum bore of the drive shaft initially actuates the pressure element for centering the substrate and then, after a particular delay, causes the substrate to be sucked against the disk with high force.

With the spinning plate according to the invention, the substrate, say, a ceramic substrate, instead of being loosely arranged on the circular plate and supported only radially, is sucked against the circular plate by a vacuum so that it is retained by the support blocks and not spun off. To ensure that the substrate is reliably sucked against the circular plate, the projecting substrate edge is provided with a sealing. The suction chamber between the substrate and the disk, which is confined by this sealing, is evacuated through a vacuum bore in the drive shaft. As the sealing rests against the outer edge of the substrate, there is a large area in which the low pressure may become effective, so that the substrate is retained on the circular plate with great force. In addition, the sealing hermetically seals the lower active surface of the substrate facing the circular plate, so that the substances used to treat the upper active surface do not affect the lower surface.

One way of carrying out the invention is described in detail below with reference to drawings which illustrate only one specific embodiment, in which.

Figure 1:
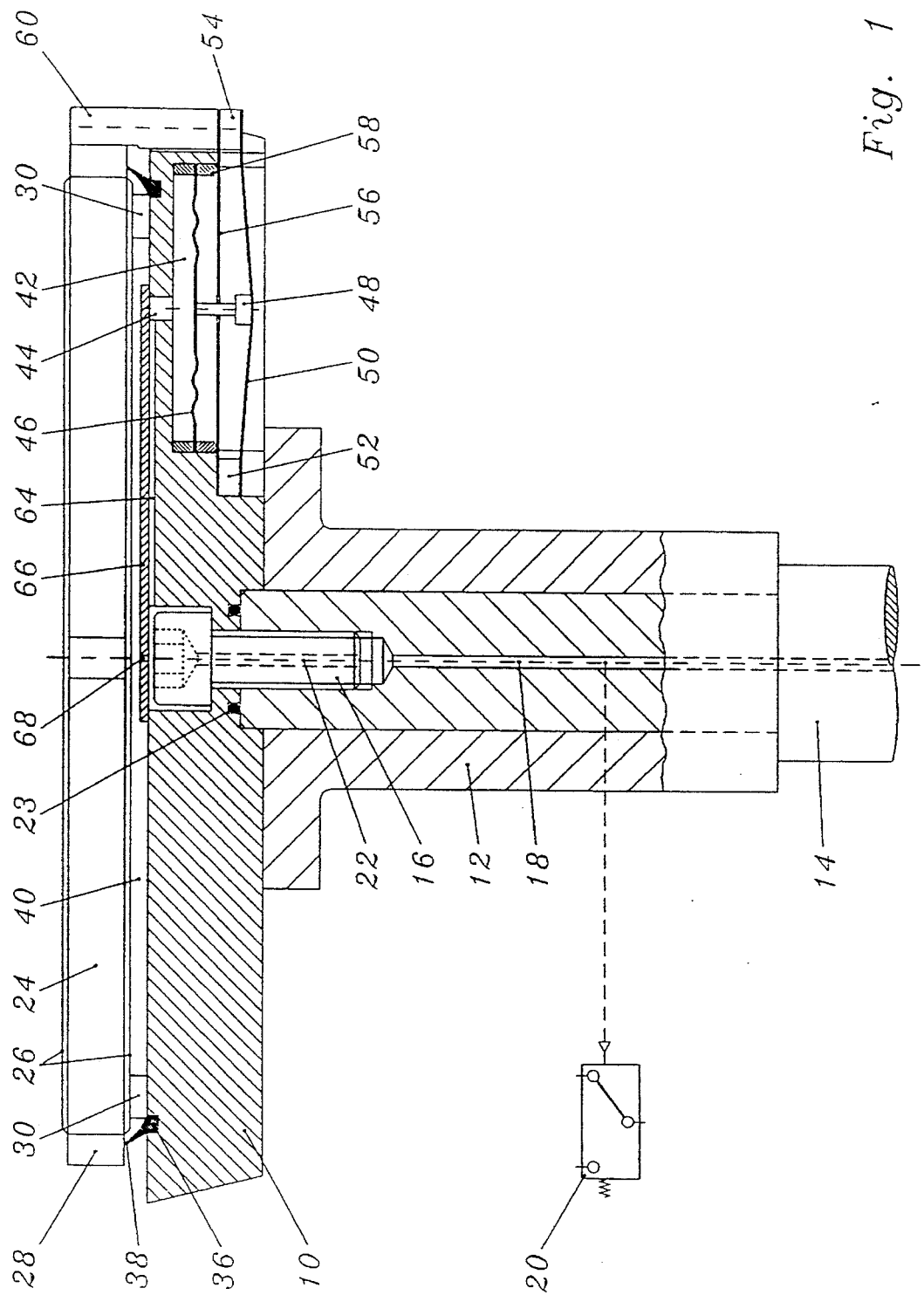
FIG. 1 is a diagonal axial sectional view of the spinning plate relative to a ceramic substrate supported thereon.
Figure 2:
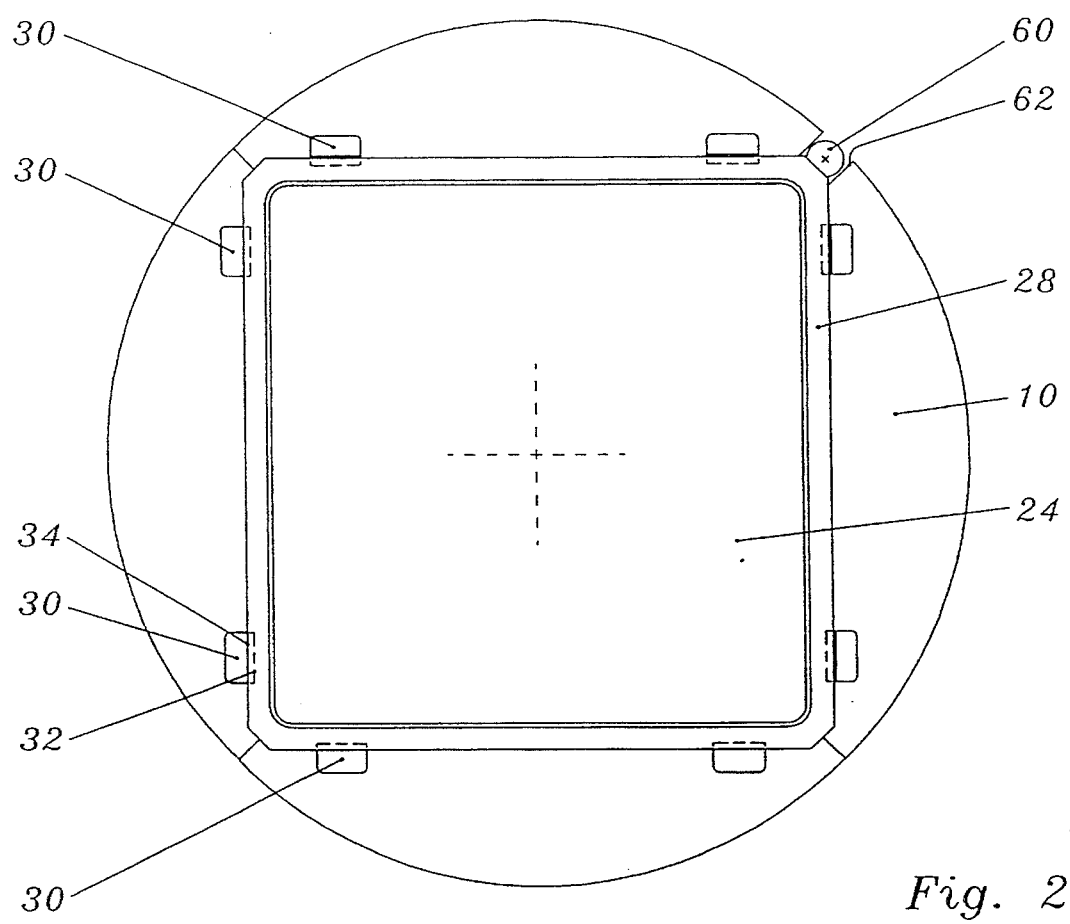
FIG. 2 is a plan view of the spinning plate.

According to FIGS. 1 and 2, the spinning plate is provided with a circular plate 10 which is screwed to a hub 12. With respect to the rotary drive of the circular plate, the hub is positively supported on a drive shaft 14. The circular plate 10 is axially secured on the drive shaft 14 by means of a concentric screw 16. The drive shaft 14 has a coaxial vacuum bore 18 which for applying a vacuum is connected to a suction pump. The low pressure produced is detected by means of a conventional vacuum switch 20. Drive shafts 14 with a vacuum bore 18 and a vacuum switch 20 exist in some conventional systems to check and determine whether a circular plate is appropriately supported on the drive shaft.

The screw 16 has a coaxial through-bore 22 adjoining the vacuum bore 18 of the drive shaft 14, so that the vacuum bore 18 extends beyond bore 22 up to the surface of the circular plate 10. An O-ring 23, inserted between the drive shaft 14 and the circular plate, seals the vacuum connection.

The top side of the circular plate 10 accommodates a ceramic substrate 24. The ceramic substrate 24 has two active surfaces 26. A continuous recessed ground edge 28 of the ceramic substrate 24 projects from the active surfaces 26. This edge 28 serves to handle the substrate 24, whose active surfaces 26 must not be touched.

The top side of the circular plane 10 is provided with support blocks 30 for accommodating the ceramic substrate 24. Each of the support blocks 30 has a horizontal bearing surface 32 supporting the edge 28 of the substrate 24 and a vertical support face 34 securing the substrate 24 on the outer face of the edge 28 against radial displacement.

The illustrated example concerns a square ceramic substrate 24. Accordingly, there are eight support blocks 30 retaining in pairs the four edges of the substrate 24. For treating other substrate shapes, for example, multi-edge or circular substrates, the support blocks 30 would have to be provided in another arrangement and number.

A continuous sealing 36 corresponding to the shape of the ceramic substrate 24 is inserted in the top face of the circular plate 10. Sealing 36 is arranged inside the supports blocks 30, resting from below against the edge 28 of the substrate 24. For this purpose, the elastic sealing 36 has a bell-shaped thinned upper lip edge 38 which is inclined to the outside to project slightly from the plane of the horizontal bearing surfaces 32 of the support blocks 30 when there is no substrate 24 on the spinning plate. When the substrate 24 is placed on the spinning plate, the edge 28 of the substrate 24 initially rests against the upper lip edge 38 of the sealing 36. In response, the lip edge 38 yields elastically until the edge 28 of the substrate 24 rests on the horizontal bearing surfaces 32 of the support blocks 30. The edge 28 of the substrate 24 is sealed by the lip edge 38 of sealing 36 resting against in with slight elastic pressure.

As a result, a suction chamber 40, sealed on all sides by sealing 36, is formed between the ceramic substrate 24 and the circular plate. This suction chamber 40 may be evacuated through vacuum bore 18 and bore 22, with the bell-shaped sealing inclined to the outside being pulled inside by the low pressure and its lip edge 38 being forced against the edge 28 of the substrate 24 as an additional sealing means. The low pressure produced in the suction chamber 40 acts on the entire large area of the substrate 24 surrounded by the sealing 36 so that the substrate is retained with great force on the support blocks 30.

An eccentric membrane chamber 42 is worked into the bottom side of the circular plate 10 close to its circumference. Membrane chamber 42 is connected to the top side of the circular plate 10 through a bore 44. Towards the bottom side, the membrane chamber 42 is sealed by a membrane 46 formed as a corrugated membrane. The bottom side of the membrane 46 opposite to the membrane chamber 42 is provided in its center with a stem 48. The other end of the stem 48 is fixed roughly to the center of an elongated leaf spring 50. Leaf spring 50 is radially arranged on the bottom side of the circular plate 10. Stem 48 is fixed to the central downward curved region of spring 50. The radial inner end of the leaf spring 50 has a stop 52 rigidly fixed to the circular plate 10. The radial outer end of the leaf spring 50 is fixed to a spacer 54. Between the membrane 46 and the curved leaf spring 50 a further, planar, leaf spring 56 is provided which extends in a radial direction parallel to the curved leaf spring 50. The inner end of leaf spring 56 is also fixed to the circular plate 10 by stop 52. The radial outer end of the leaf spring 56 projects from a downward pointing rounded bending edge 58 of the circular plate 10 and carries on the bottom side of the projecting end the spacer 54, to the bottom side of which the curved leaf spring 50 is fixed. Stem 48 extends freely movable through a bore of the planar leaf spring 56. Opposite to the spacer 54, a pin-shaped pressure element 60 is fixed to the top side of the outer end of the leaf spring 56 projecting from the bending edge 58. The pressure element 60 extends through a circumferential recess 62 of the circular plate 10 beyond the surface of said plate. At one corner of the ceramic substrate 24, the upper end of the pressure element 60 rests from the outside against the substrate edge 28. The pressure element 60 is pivotable to the inside by deflecting leaf spring 56 about the bending edge 58. Joints in which the liquid substance used for treatment might accumulate are not required for the pivotable support by the leaf spring 56 and the pivotal movement effected by the membrane 46, the stem 48 and the curved leaf spring 50. As a result, the entire mechanism may be thoroughly cleaned without any difficulty.

The top face of the circular plate 10 has a radial channel 64. This channel is sealed from the suction chamber 40 by a cover strip and extends from the bore 22 of screw 16 to the bore 44 of membrane chamber 42. A throttle bore 68 having a smaller cross-section than channel 64 extends through the cover strip 66 to the suction chamber 40.

The spinning plate operates as follows.

The ceramic substrate 24 is placed on the support blocks 30 of the circular plate 10. For this purpose, the vertical support faces 34 of the support blocks 30 have a slight radial play relative to the front face of the edge 28 of substrate 24. When the pin-shaped pressure element 60 contacts the edge 28 of substrate 24 as the latter is being positioned, the pressure element 60 is forced slightly radially to the outside, causing the leaf springs 50 and 56 to yield elastically. This radial movement towards the outside may be enhanced by a slope at the top edge of the pressure element 60.

The substrate 24 with its edge 28 rests on the lip edge 38 of the sealing 26 forcing the latter down until edge 28 is supported by the horizontal bearing surfaces 32 of the support blocks 30. As a result, suction chamber 40 is sealed.

Then air is sucked off through vacuum bore 18. As the channel 64 has a larger cross-section than the throttle bore 68 and the membrane chamber 42 has a smaller volume than the suction chamber 40, initially a vacuum is built up in membrane chamber 42. By this vacuum, membrane 46 is pulled upwards, so that stem 48 is pulled upwards as well, while the downward curved leaf spring assumes its non-tensioned elongated state. In response thereto, a radial thrust moves the outer end of the leaf spring 50 to the outside so that the bottom side of the spacer 54 follows suit. During this, the planar leaf spring 56 bends upwards about bending edge 58 and the pressure element 60 is radially forced to the inside with great leverage. In response, the pressure element 60 pushes the substrate 24 against the vertical support faces 34, acting as centering stops, of the diametrically opposed support blocks.

Upon completion of this centering step, a vacuum has built up in suction chamber 40 which then rigidly forces the lip edge 38 of the sealing 36 against the edge 28 of the substrate 24, thus retaining the latter with great force on the support blocks 30.

The vacuum switch 20 signals when the low pressure necessary for retaining the substrate 24 has been reached and spinning may take place.

Figure 3:
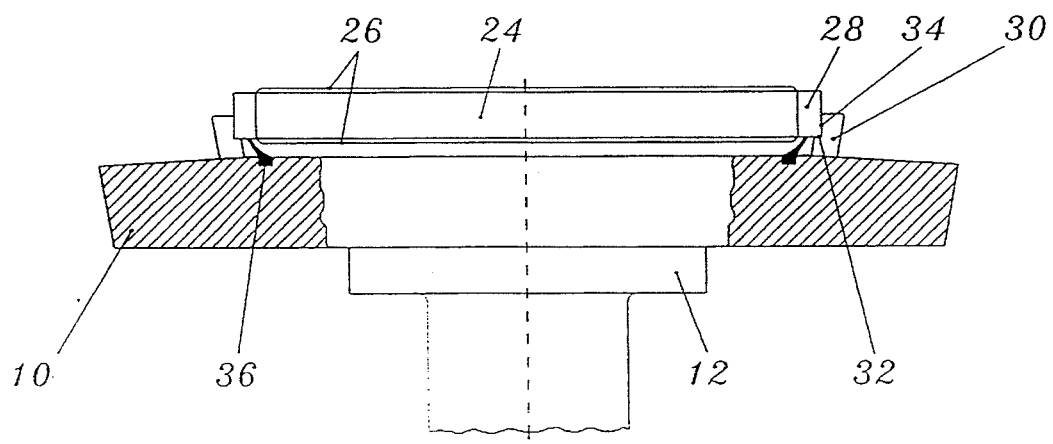
FIG. 3 is a parallel axial partial sectional view of edge spinning plate relative to the lateral edge of the ceramic substrate.

The circumferential face of the circular plate 10 is sloped with a downward taper. As a result, the upper outer edge of the circular plate 10 is acutely angled, serving as a removal edge for spun-off liquid substances used for treatment. This effect is enhanced still further by the surface of the circular plate 10 in the area of the edge projecting from the support blocks 30 being sloped slightly to the outside, as shown in FIG. 3. As a result, the liquid substances on the circular plate 10 flow to its periphery so that during the spinning process they are spun-off the upper, removal, edge of the circular plate in a defined manner.

We claim:

1. A spinning plate comprising a circular plate having a surface for accommodating substrates having two active surfaces and a continuous edge having a bottom side opposite said circular plate projecting therefrom, with said circular plate centrally supported by a vertical drive shaft, support blocks arranged on the surface of the circular plate which have horizontal bearing surfaces and vertical support faces for the edge of the substrate, and a vacuum bore axially extending in the drive shaft, characterized in that a circumferential sealing, resting against the bottom side of the edge of the substrate, is provided on the surface of the circular plate, and that the vacuum bore extends through the circular plate into a suction chamber formed between the circular plate and the substrate and which is surrounded by the sealing, with at least two said support blocks having their vertical support faces arranged in one half of the circular plate serving as centering stops for the substrate, and that opposite these support blocks in the other half of the circular plate a pressure element is provided which by a radially directed force is moved against the edge of the substrate, causing the latter to rest against the centering stops, wherein the pressure element is moved against the edge of the substrate with the aid of a membrane means to which a vacuum is applied through the vacuum bore.

2. The spinning plate of claim 1, characterized in that the sealing has a bell-shaped thinned upper lip edge, inclined to the outside, projecting from the plane of the horizontal bearing surfaces of the support blocks.

3. The spinning plate of claim 1, characterized in that a throttle means is provided which delays the formation of the vacuum in the suction chamber before it is applied to the membrane means.

4. The spinning plate of claim 3, characterized in that the vacuum bore is connected to the membrane means through a channel and to the suction chamber through a throttle bore of a smaller diameter.

5. The spinning plate of claim 1, characterized in that the membrane means comprises a membrane chamber, formed in the circular plate and sealed by a membrane, which communicates with the vacuum bore, and that an actuator means pivoting the pressure element is provided on the side of the membrane opposite to the membrane chamber.

6. The spinning plate of claim 5, characterized in that the actuator means is provided with a stem having one end fixed to the membrane and the other end roughly centrally to a leaf spring, that the leaf spring has one permanently fixed end, while its other end is fixed to the pivotably supported pressure element, and that the left spring is curved in its longitudinal extension such that when the vacuum is applied to the membrane, the stem causes the leaf spring to assume its non-tensioned state.

7. The spinning plate of claim 6, characterized in that the pressure element is pivotably supported by being fixed to the free end of leaf spring which bends about a bending edge.

8. The spinning plate of claim 1, characterized in that the surface of the edge of the circular plate projecting from the support blocks is sloped to the outside while its circumferential face is tapered downwards.

* * * * *